United States Patent [19]

Bengston

[11] Patent Number: 5,431,739
[45] Date of Patent: Jul. 11, 1995

[54] PROCESS FOR CLEANING AND DEFLUXING PARTS, SPECIFICALLY ELECTRONIC CIRCUIT ASSEMBLIES

[75] Inventor: Jon Bengston, West Hartford, Conn.

[73] Assignee: MacDermid, Incorporated, Waterbury, Conn.

[21] Appl. No.: 255,249

[22] Filed: Jun. 7, 1994

[51] Int. Cl.⁶ ............................................. C09D 9/00
[52] U.S. Cl. ........................................ 134/2; 134/40; 134/42
[58] Field of Search ............... 134/2, 40, 42; 252/162, 252/153, 545

[56] References Cited

U.S. PATENT DOCUMENTS

| | | | |
|---|---|---|---|
| 4,294,729 | 10/1981 | Bakos et al. | 134/42 |
| 4,635,666 | 1/1987 | Daley et al. | 134/72 |
| 4,640,719 | 2/1987 | Hayes et al. | 134/40 |
| 4,740,247 | 4/1988 | Hayes et al. | 134/42 |
| 5,128,057 | 7/1992 | Bixenman et al. | 134/40 |
| 5,264,046 | 11/1993 | Winston et al. | 134/42 |
| 5,308,402 | 5/1994 | Bixenman et al. | 134/2 |

*Primary Examiner*—Scott Kastler
*Attorney, Agent, or Firm*—John L. Cordani

[57] ABSTRACT

The present invention relates to environmentally safe flux removing compositions specifically formulated for cleaning electronic circuit assemblies, such as printed circuit boards, during the fabrication thereof. Aryl alcohols, such as benzyl alcohol, are used to remove solder flux, oils and other contaminates from various substrates.

12 Claims, No Drawings

PROCESS FOR CLEANING AND DEFLUXING PARTS, SPECIFICALLY ELECTRONIC CIRCUIT ASSEMBLIES

FIELD OF THE INVENTION

The present invention relates to environmentally safe flux removing compositions specifically formulated for cleaning electronic circuit assemblies, such as printed circuit boards, during the fabrication thereof. Aryl alcohols, such as benzyl alcohol, are used to remove solder flux, oils, waxes and greasy substances, as well as adhesives and other residues from various substrates.

BACKGROUND OF THE INVENTION

The cleanliness of electronic circuit assemblies (ECA'S), such as printed circuit board (PCB's) is critical to their proper function and reliability. Contamination leads, in many cases, to premature failure of the assemblies. Failures in this regard will mainly be due to the formation of shorts.

In the manufacture of electronic circuit assemblies, contamination can accumulate throughout the various steps of the fabrication process. One of the final steps in the fabrication process is the application of soldering flux, followed by various soldering operations. In practice, however, these fluxes have proven difficult to effectively remove.

In the fabrication of electronic circuit assemblies, soldering fluxes are applied to the substrate to ensure firm, uniform bonding of the solder. These soldering fluxes fall into two broad categories: rosin and non-rosin, or water soluble fluxes. The rosin fluxes in general provide superior overall soldering performance as compared to the non-rosin fluxes. Thus, the rosin fluxes are widely used in the industry. Non-rosin or water soluble fluxes are generally inferior in soldering performance and tend to be more corrosive and therefore are not as widely utilized as the rosin fluxes.

One advantage of the non-rosin fluxes is their ability to be effectively cleaned using water based alkaline cleaners which have been known for years. According to U.S. Pat. No. 5,264,046 (Winston, et al), whose teachings are incorporated herein by reference in their entirety, these alkaline cleaners may also be utilized to clean rosin based fluxes, however, the ultimate cleanliness of the assemblies cleaned with Winston's process, is questionable.

Rosin based fluxes have traditionally been cleaned out most effectively with chlorinated hydrocarbon solvents, such as 1,1,1-trichloroethane, CFC 113 and CFC 112 or mixtures or azeotropes of these and other solvents. These solvents are undesirable, however, because they are toxic and when released into the environment, deplete the ozone layer and/or contribute to the greenhouse effect. Thus, these solvents are subject to close scrutiny by the Occupational Safety and Health Administration and the Environmental Protection Agency.

In addition, alkaline cleaning compounds based on alkanolamines and/or caustic (U.S. Pat. No. 4,635,666) have been used in removing rosin fluxes. However, these processes have the distinct disadvantage of being significantly corrosive to solder and other materials of construction in the electronic assemblies. The related teachings of Winston, et al. have further specified the conditions of these processes by proposing particular alkaline solutions, which have been known for some time and which may be effective at flux removal.

In other approaches, Hayes et al., U.S. Pat. Nos. 4,640,719 and 4,740,247, rosin soldering flux and other residues are removed from electronic assemblies by means of terpene compounds in combination with terpene emulsifying surfactants by rinsing in water.

In addition to solder flux removal, the complete removal of adhesives and other residues also poses a problem. During the fabrication process, various tapes and/or adhesives may be utilized on a temporary basis. Once such protection is no longer needed, the adhesive residues must be removed. Removal of these adhesive residues has traditionally been carried out by the use of chlorinated solvents which, as already described, are toxic and environmentally undesirable.

Thus, the present invention addresses a method for effectively removing various residual contaminates, which are likely to be found on electronic circuit assemblies, including, without limitation, rosin flux, photoresist residue, soldermask residue, adhesive residues, oils, greases, silicones, lanolin, mold release, non-rosin fluxes, polyglycols, plasticizers and other problematic residues.

SUMMARY OF THE INVENTION

The cleanliness of electronic circuit assemblies such as printed circuit boards is critical to their proper function and reliability. Contamination leads, in many cases, to premature failure of the assemblies due to the formation of shorts. It is an object of the present invention to provide compositions and methods for the safe and effective removal of rosin soldering fluxes and other contaminants from electronic circuit assemblies.

This invention provides cleaning compositions and methods for the removal of rosin solder fluxes and other residues during fabrication of printed circuit boards. As a result, the possibility of premature circuit failure that might occur otherwise is eliminated. The cleaning efficacy of the compositions and processes of this invention is such that printed circuit boards thus treated meet and exceed stringent standards.

The compositions of the invention are characterized by their effectiveness, low environmental impact and safety. Thus, the composition and process of the present invention presents a significant advance over the prior art.

The present invention provides electronic circuit assembly (printed circuit board) cleaning compositions comprising aryl alcohols with at least one alkyl chain which is from 1 to 10 carbons long and which chain also possesses alcohol functionality. Effective compositions can be formed with aqueous solutions of the aryl alcohols of the present invention. Concentration of the aryl alcohol in water may range from 0.1 to 100 percent by weight. These cleaning compositions work effectively at temperatures from 50° to 200° F.

The cleaning compositions of this invention are further substantially improved by the addition of corrosion inhibitors, anti-oxidants, wetting agents, surfactants, emulsifiers and antifoam agents. When used according to the above description, the compositions of the present invention do not leave an undesirable residual film and are most effective in removing the fluxes and other contaminates from printed circuit boards.

DETAILED DESCRIPTION OF THE INVENTION

The object and advantages mentioned above, as well as other objects and advantages, may be achieved by the compositions and methods hereinafter described.

Essentially, the flux/contamination removing compositions of the invention comprise mixtures of aryl alcohols, with at least one alkyl chain, from 1 to 10 carbons long, which chain also possesses alcohol functionality, and water. The concentrations of said aryl alcohols with water may range from 0.1 to 100 percent by weight, most preferably from 5 to 8 percent by weight. The effective temperature for utilizing these aryl alcohol solutions is from 50° to 150° F.

In the most preferred embodement of this invention, benzyl alcohol, is utilized in a solution with water. The concentration of benzyl alcohol may range from 0.1 to 100 percent by weight most preferrably from 5 to 10 percent by weight. The temperature of operation may range from 50° to 150° F. but is most effective at from 70° to 120° F.

In accordance with the invention, additives such as wetting agents, surfactants, corrosion inhibitors, emulsifiers and antifoam agents may be employed along with the aryl alcohol and water to improve performance. Corrosion inhibitors may consist of various compounds such as silicates, meta silicates, silanes, or known organic or inorganic anti corrosion or anit-oxidant compounds. The surfactants or wetting agents can be any of the numerous known compounds commercially available (i.e., non-ionics, anionics, cationics, amphoterics or mixtures there of).

In addition, some aryl alcohols proposed here, may not be readily soluble in water at the desired concentrations. In this case, various emulsifiers may be effectively utilized to create an aqueous emulsion of the particular aryl alcohol. Suitable emulsifiers are well known in the art and a variety of known emulsifiers will be effective with any one particular aryl alcohol.

When compositions and processes of this invention are utilized according to the above indicated parameters, various advantages are achieved. Firstly, these aryl alcohols perform exceptionally well. They clean the assembly surfaces to meet even the most stringent requirements and standards. Secondly, the compositions of the present invention are safe. They pose no significant fire hazard, and are not caustic to the skin, as the prior art alkaline cleaners are. Thirdly, the present compositions are relatively environmentally friendly. They possess no ozone depleting CFC's and contain low to no volatile organic carbons (VOC's).

The most significant advantage is their performance in cleaning assemblies to the most stringent standards. Boards cleaned with the process of the current invention produce residual contamination readings in the range of 0 to 2 microgram equivalent of NaCl per square inch as determined per MIL-P-5511OC and MIL-P-28809A. Boards cleaned with the process of Winston et al and most other prior art solutions yield residual contamination readings in the range of 2 to 20 microgram equivalent of NaCl per square inch. Obviously, the cleanliness of boards cleaned with the process of the present invention exhibit superior cleanliness. This enhanced cleanliness is achieved at substantially lower temperatures than the teachings of Winston, et al (i.e., 120° F. versus 160° F.). In addition, the compositions of the present invention are easily rinsed and, in fact, can serve as a no rinse cleaner when utilized at 100% concentration.

The invention is further described in the following examples, which are given for illustrative purposes only and are, in no way, limiting.

EXAMPLE I

A printed circuit board was treated with a mildly activated rosin flux (RMA) and subsequently soldered. The board was then placed in a standard spray cleaning apparatus which contained the following composition:

|  | Percent by Weight |
| --- | --- |
| Benzyl Alcohol | 8.0% |
| Water | 92.0% |

The board was then washed for ten (10) minutes at 120° F. After removal and rinsing, the board had no apparent flux residue on the surface. In addition, the solder was bright and clean, indicating that the solder was not substantially attacked by the process.

Cleanliness measurements were then made with the use of an Alpha Omega meter according to MIL-P-551OC and MIL-P-28809A. The cleanliness of the board in these tests is related to increases in conductance of the test solution over a period of time after circulating the test solution over the cleaned printed circuit board in the Alpha Omega test module.

A cleanliness measurement of 1 microgram equivalent of NaCl per square inch was achieved. This is substantially lower than the 14 microgram per square inch standard of the industry.

EXAMPLE II

A printed circuit board was treated with a mildly activated rosin flux (RMA), being the same flux used in Example 1, and subsequently soldered. The board was then cleaned in the same apparatus and using the same procedure as given in Example I, except the temperature was 160° F. and the following composition was utilized instead:

|  | Percent by Weight |
| --- | --- |
| Potassium Carbonate | 2.6% |
| Sodium Bicarbonate | 0.5% |
| Sodium Carbonate | 0.5% |
| Water | 96.4% |

The solder was found to be reasonably bright but not as bright as in Example I.

Cleanliness measurements were then made, utilizing the same procedures as in Example I. These measurements yielded a result of 5 micrograms of equivalent NaCl per square inch.

Thus, in comparing the teaching of Winston, et al (e.g., Example II) with the present invention (Example I) significantly improved cleanliness readings can be obtained using the process of this invention. The present invention is clearly a significant advance over the prior art.

What is claimed is:

1. A single chemical step method for removing contaminates from a substrate, said method consisting essentially of contacting the substrate with an aqueous solution comprising an aryl alcohol and at least ten percent by weight water, which aryl alcohol has the formula:

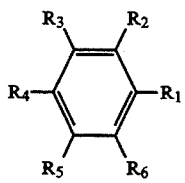

wherein at least one of the constituents, $R_1$, $R_2$, $R_3$, $R_4$, $R_5$ and $R_6$, must be selected from the group consisting of substituted or unsubstituted alkyl alcohols of from 1 to 10 carbons in length and hydroxy groups and wherein the remaining constituents, $R_1$, $R_2$, $R_3$, $R_4$, $R_5$ and $R_6$, are selected from the group consisting of hydrogen, nitro groups, halides, substituted or unsubstituted alkyl groups and substituted or unsubstituted aryl groups.

2. A method according to claim 1, wherein the said aryl alcohol is selected from the group consisting of phenyl alcohol, benzyl alcohol, and ethyl phenyl alcohol.

3. A method according to claim 1, wherein the contaminates comprise solder flux residues.

4. A method according to claim 1, wherein said solution also comprises at least one additive selected from the group consisting of corrosion inhibitors, anti-oxidants, antifoam agents, surfactants, wetting agents and mixtures thereof.

5. A method according to claim 1 wherein the solution also comprises an emulsifier which emulsifier is effective in forming an aqueous emulsion of the aryl alcohol.

6. A method according to claim 2, wherein the contaminates comprise solder flux residues.

7. A method according to claim 2, wherein said solution also comprises at least one additive selected from the group consisting of corrosion inhibitors, antioxidants, antifoam agents, surfactants, wetting agents, and mixtures thereof.

8. A method according to claim 2 wherein the solution also comprises an emulsifier which emulsifier is effective in forming an aqueous emulsion of the aryl alcohol.

9. A method according to claim 4, wherein the contaminates comprise solder flux residues.

10. A method according to claim 4 wherein the solution also comprises an emulsifier which emulsifier is effective in forming an aqueous emulsion of the aryl alcohol.

11. A method according to claim 7, wherein the contaminates comprise solder flux residues.

12. A method according to claim 7, wherein the solution also comprises an emulsifier which emulsifier is effective in forming an aqueous emulsion of the aryl alcohol.

* * * * *